United States Patent
Hébert et al.

(10) Patent No.: US 7,825,508 B2
(45) Date of Patent: Nov. 2, 2010

(54) MULTI-DIE DC-DC BUCK POWER CONVERTER WITH EFFICIENT PACKAGING

(75) Inventors: François Hébert, San Mateo, CA (US); Allen Chang, Fremont, CA (US)

(73) Assignee: Alpha Omega Semiconductor, Inc., Sunnyvale, CA (US)

( * ) Notice: Subject to any disclaimer, the term of this patent is extended or adjusted under 35 U.S.C. 154(b) by 583 days.

(21) Appl. No.: 11/830,996

(22) Filed: Jul. 31, 2007

(65) Prior Publication Data

US 2008/0024102 A1    Jan. 31, 2008

Related U.S. Application Data

(63) Continuation-in-part of application No. 11/830,951, filed on Jul. 31, 2007, and a continuation-in-part of application No. 11/880,497, filed on Jul. 22, 2007, now Pat. No. 7,633,135, and a continuation-in-part of application No. 11/495,803, filed on Jul. 28, 2006, now Pat. No. 7,554,154.

(51) Int. Cl.
    *H01L 23/34* (2006.01)

(52) U.S. Cl. ............... 257/724; 257/777; 257/E23.003

(58) Field of Classification Search .......... 257/723, 257/724, 777, 778, E23.003, E23.027
    See application file for complete search history.

(56) References Cited

U.S. PATENT DOCUMENTS

| | | | |
|---|---|---|---|
| 5,473,180 A | 12/1995 | Ludikhuize et al. | |
| 5,965,947 A | 10/1999 | Nam et al. | |
| 6,448,643 B2 * | 9/2002 | Cheah et al. | 257/723 |
| 6,506,648 B1 | 1/2003 | Hebert et al. | |
| 6,699,775 B2 | 3/2004 | Bol et al. | |
| 6,788,033 B2 | 9/2004 | Vinciarelli et al. | |
| 6,867,494 B2 * | 3/2005 | Kameda et al. | 257/724 |
| 6,975,023 B2 | 12/2005 | Oliver et al. | |
| 7,061,057 B2 | 6/2006 | Babcock et al. | |
| 7,154,250 B2 | 12/2006 | Vinciarelli et al. | |
| 7,195,952 B2 | 3/2007 | Vinn et al. | |
| 7,276,883 B2 | 10/2007 | Soldano | |
| 7,436,070 B2 | 10/2008 | Uno et al. | |
| 7,443,648 B2 | 10/2008 | Cutter et al. | |
| 2004/0027101 A1 | 2/2004 | Vinciarelli | |
| 2004/0169262 A1 | 9/2004 | Oliver et al. | |
| 2006/0073023 A1 | 4/2006 | Ghosal et al. | |

(Continued)

*Primary Examiner*—Tuan N. Quach
(74) *Attorney, Agent, or Firm*—Chein-Hwa Tsao; CH Emily LLC

(57) ABSTRACT

A DC-DC buck converter in multi-die package is proposed having an output inductor, a low-side Schottky diode and a high-side vertical MOSFET controlled by a power regulating controller (PRC). The multi-die package includes a first die pad with the Schottky diode placed there on side by side with the vertical MOSFET. The PRC die is attached atop the first die pad via an insulating die bond. Alternatively, the first die pad is grounded. The vertical MOSFET is a top drain N-channel FET, the substrate of Schottky diode die is its anode. The Schottky diode and the vertical MOSFET are stacked atop the first die pad. The PRC is attached atop the first die pad via a conductive die bond. The Schottky diode die can be supplied in a flip-chip configuration with cathode being its substrate. Alternatively, the Schottky diode is supplied with anode being its substrate without the flip-chip configuration.

6 Claims, 12 Drawing Sheets

Present Invention Packaging of Buck Power Converter

U.S. PATENT DOCUMENTS

| | | | |
|---|---|---|---|
| 2008/0023825 A1* | 1/2008 | Hebert et al. | ............... 257/724 |
| 2008/0024102 A1 | 1/2008 | Hebert et al. | |
| 2008/0180871 A1 | 7/2008 | Hebert et al. | |
| 2008/0197908 A1 | 8/2008 | Williams et al. | |
| 2008/0203991 A1 | 8/2008 | Williams et al. | |
| 2008/0304305 A1 | 12/2008 | Chang et al. | |
| 2008/0304306 A1 | 12/2008 | Chang et al. | |

\* cited by examiner

Fig. 1 Buck Converter Schematic
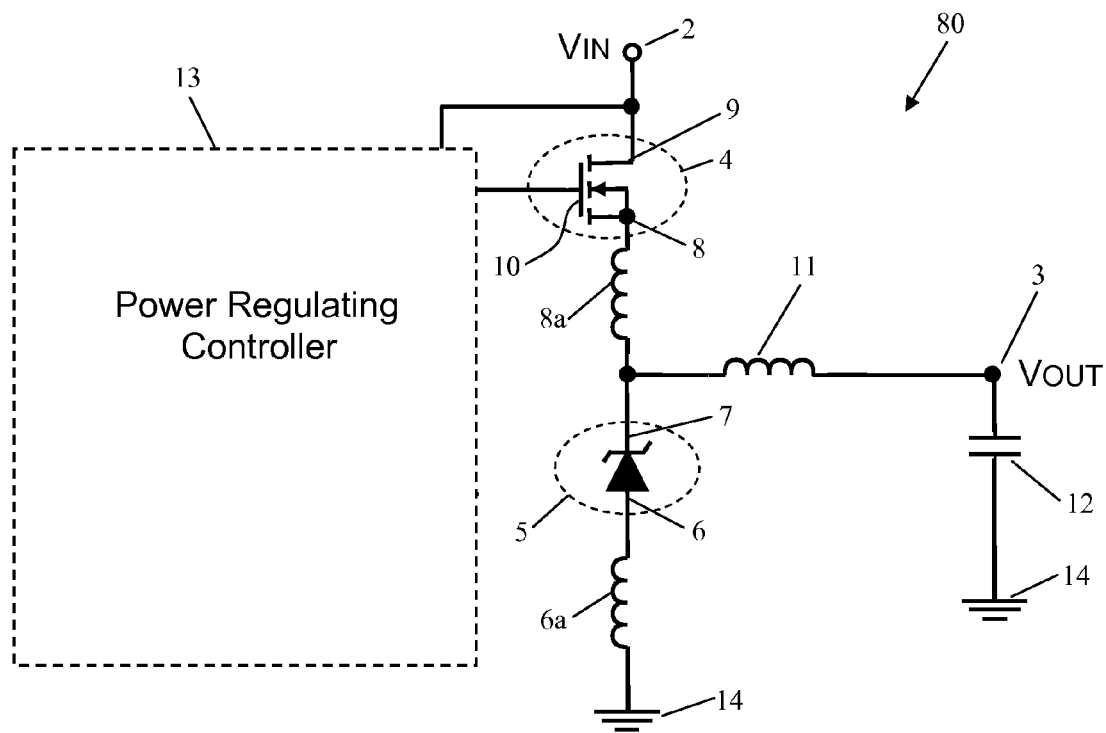

Fig. 2 Prior Art Packaging of Buck Power Converter
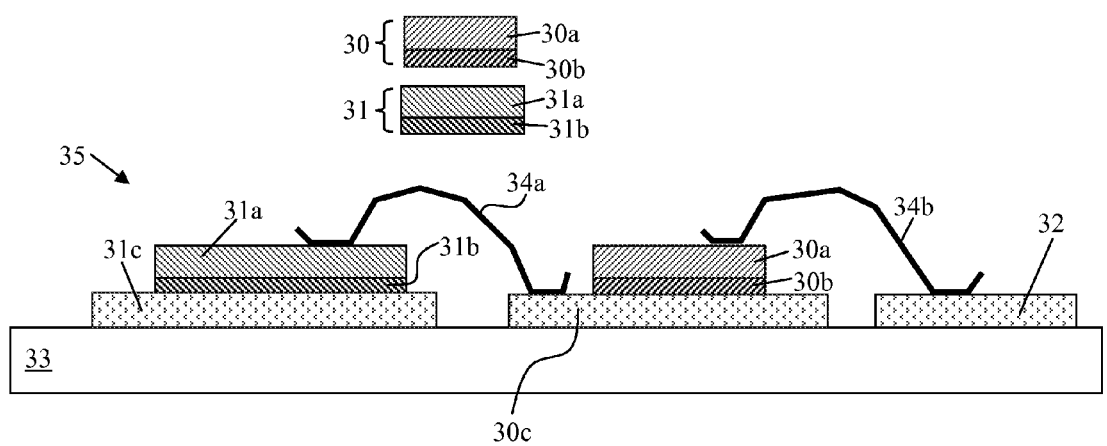

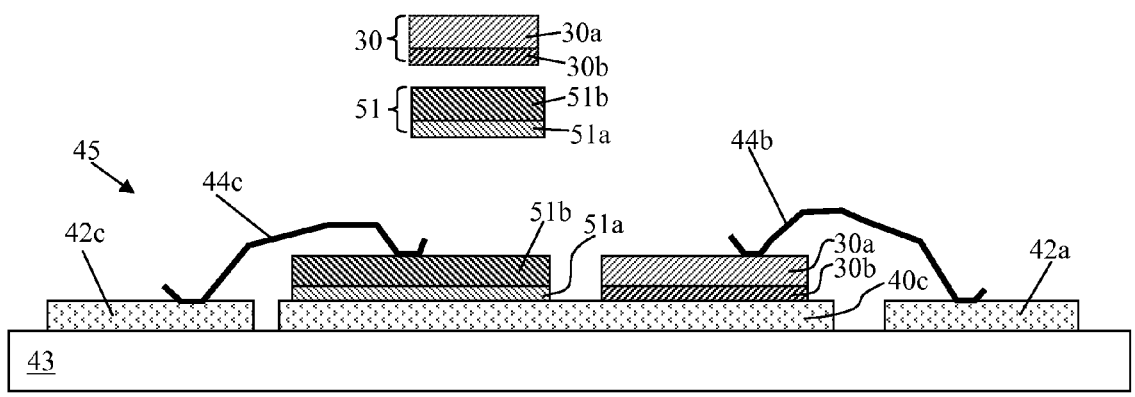
Fig. 3A Present Invention Packaging of Buck Power Converter

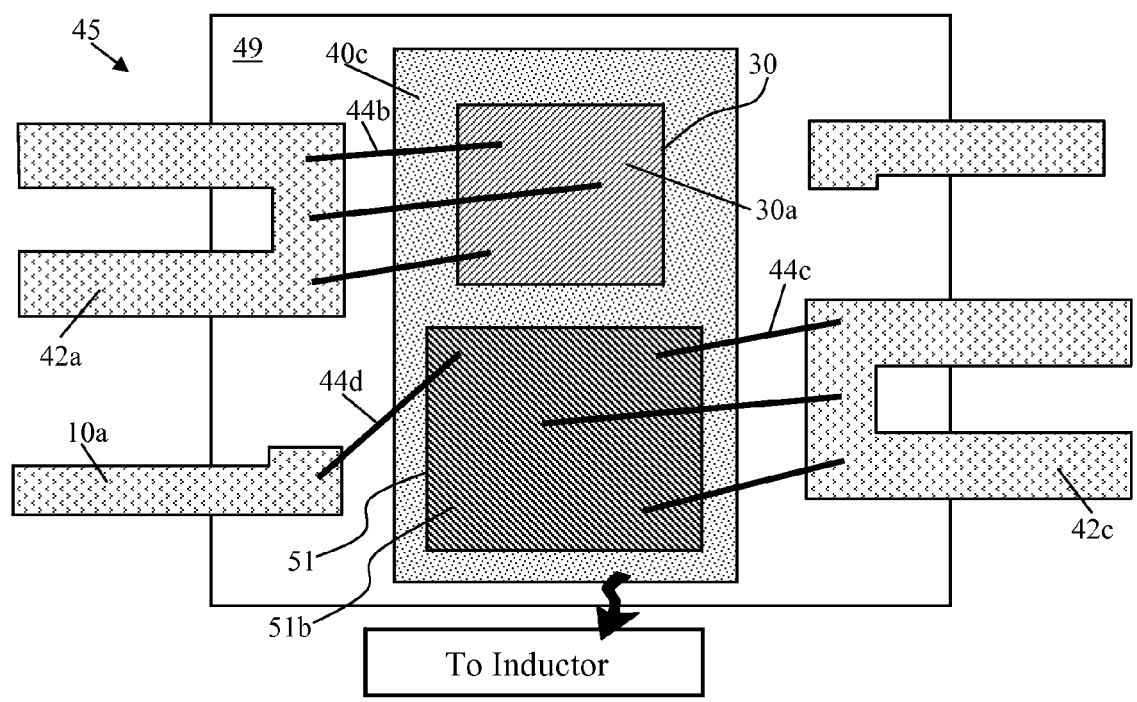
Fig. 3B Present Invention Packaging of Buck Power Converter

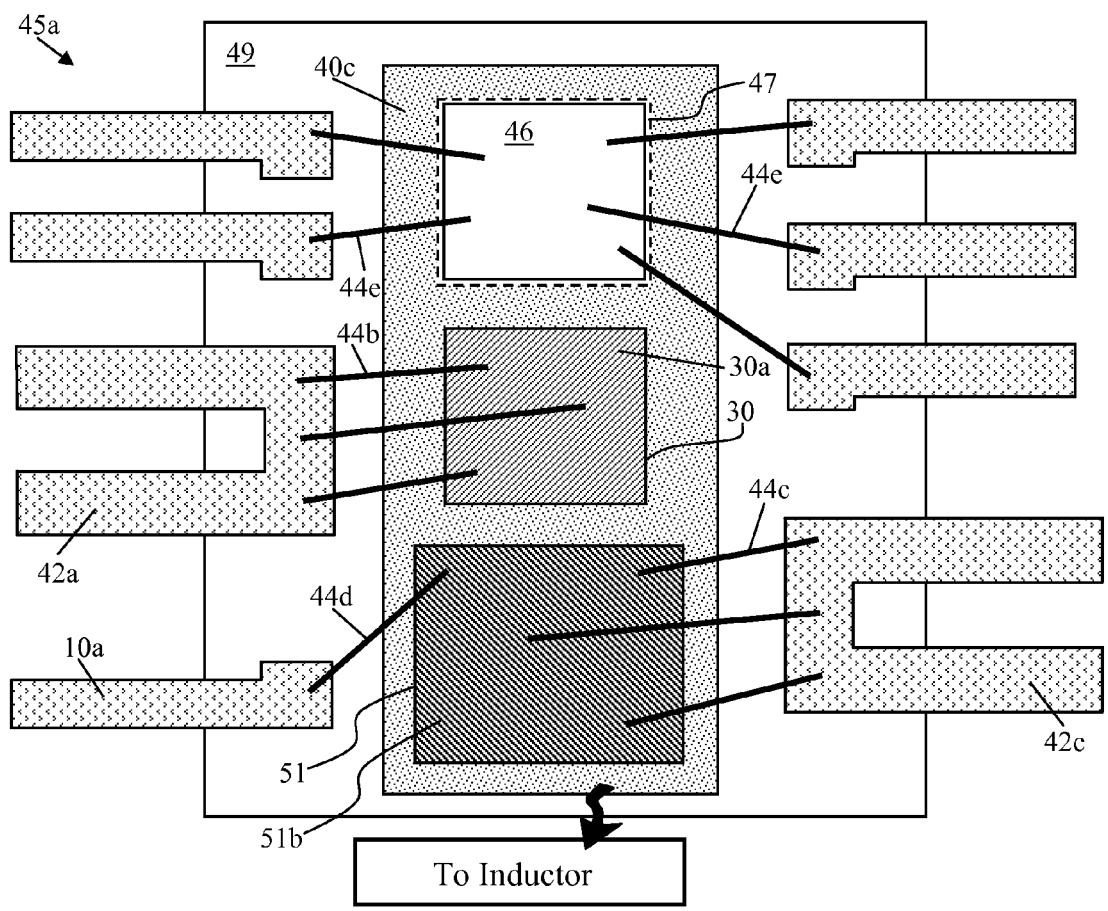
Fig. 3C Present Invention Packaging of Buck Power Converter

Fig. 3D Present Invention Packaging of Buck Power Converter
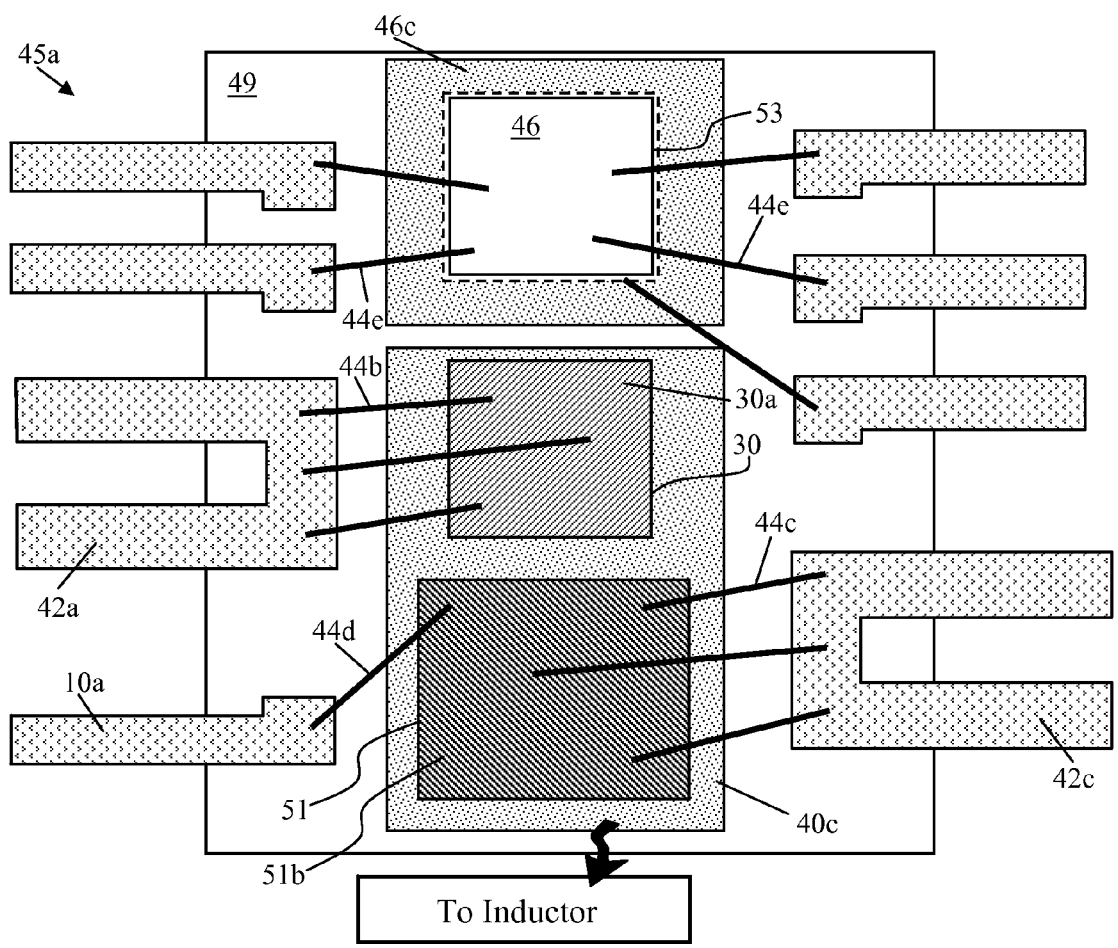

Fig. 4A Present Invention Packaging of Buck Power Converter
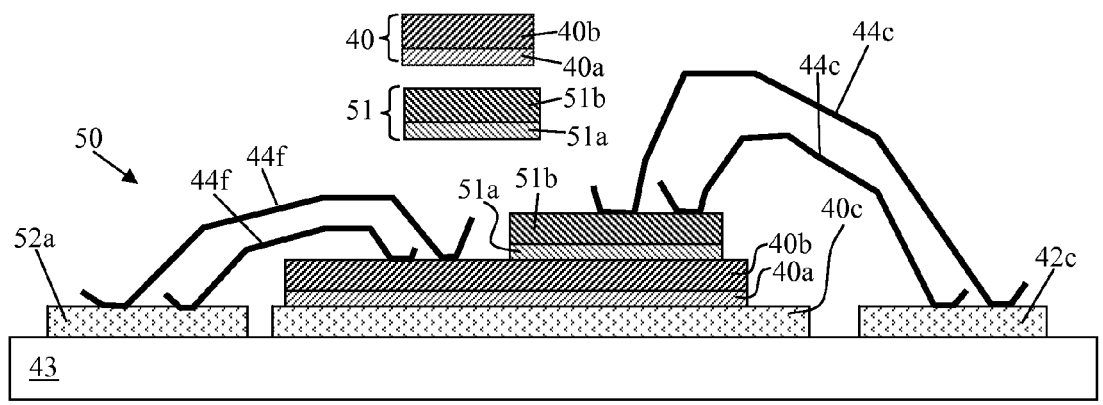

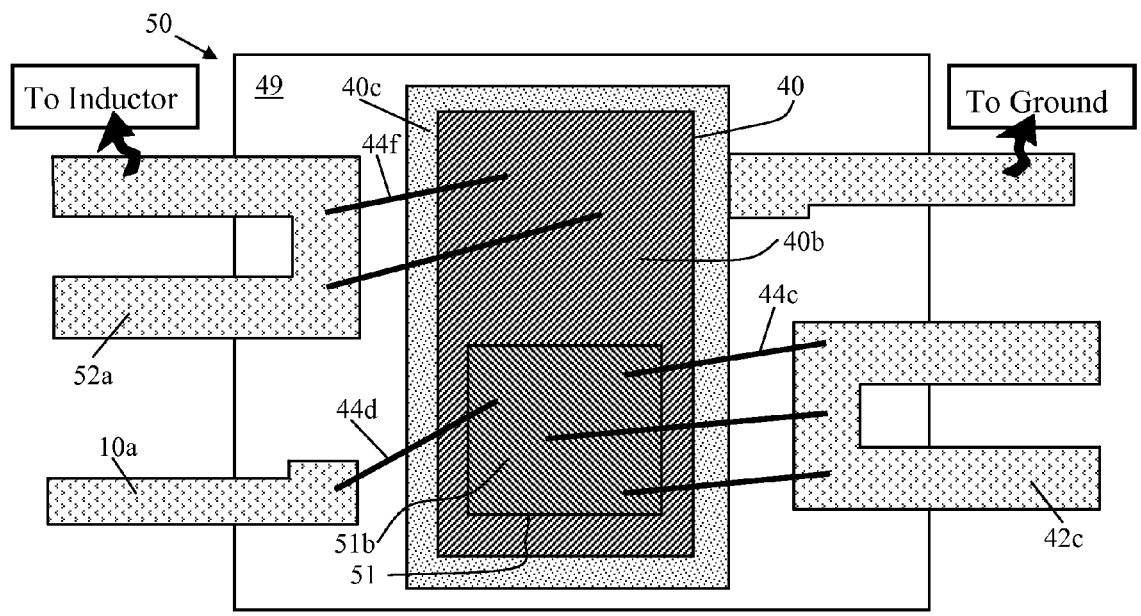
Fig. 4B Present Invention Packaging of Buck Power Converter

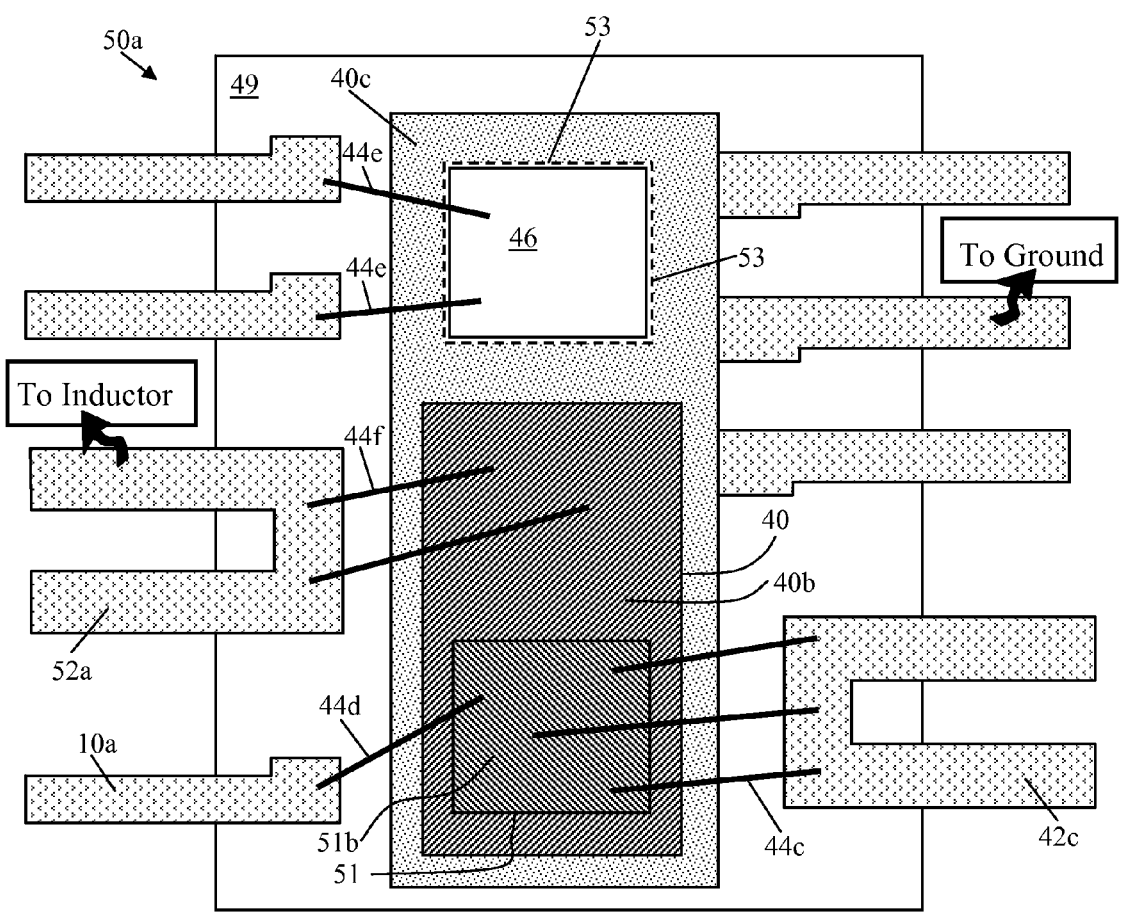
Fig. 4C Present Invention Packaging of Buck Power Converter

Fig. 5A Present Invention Flip-Chip Schottky
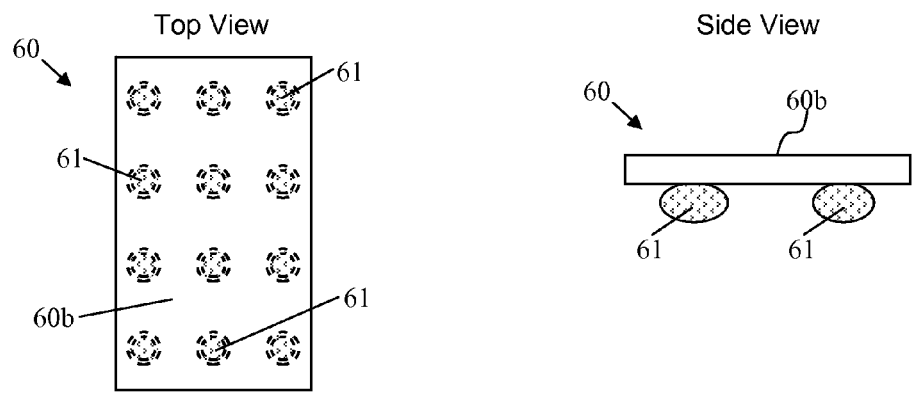
Fig. 5B Present Invention Packaging of Buck Power Converter
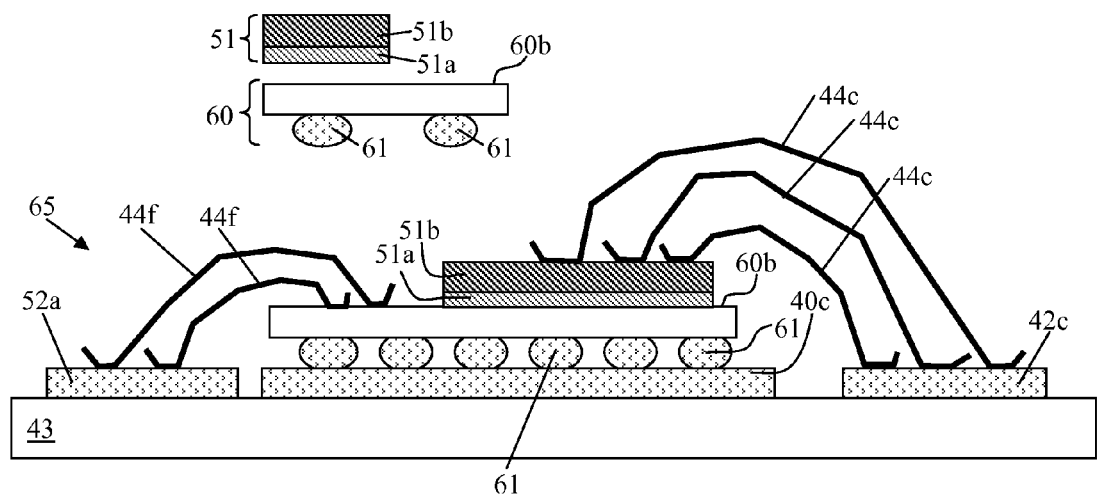

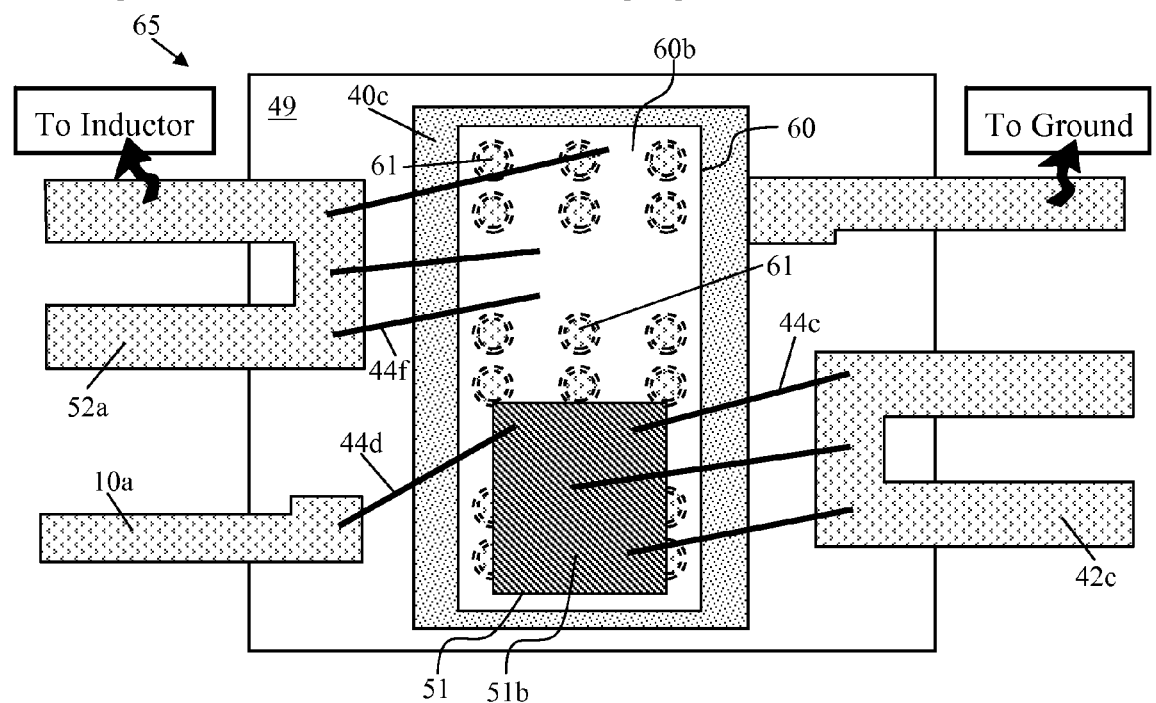
Fig. 5C Present Invention Packaging of Boost Power Converter

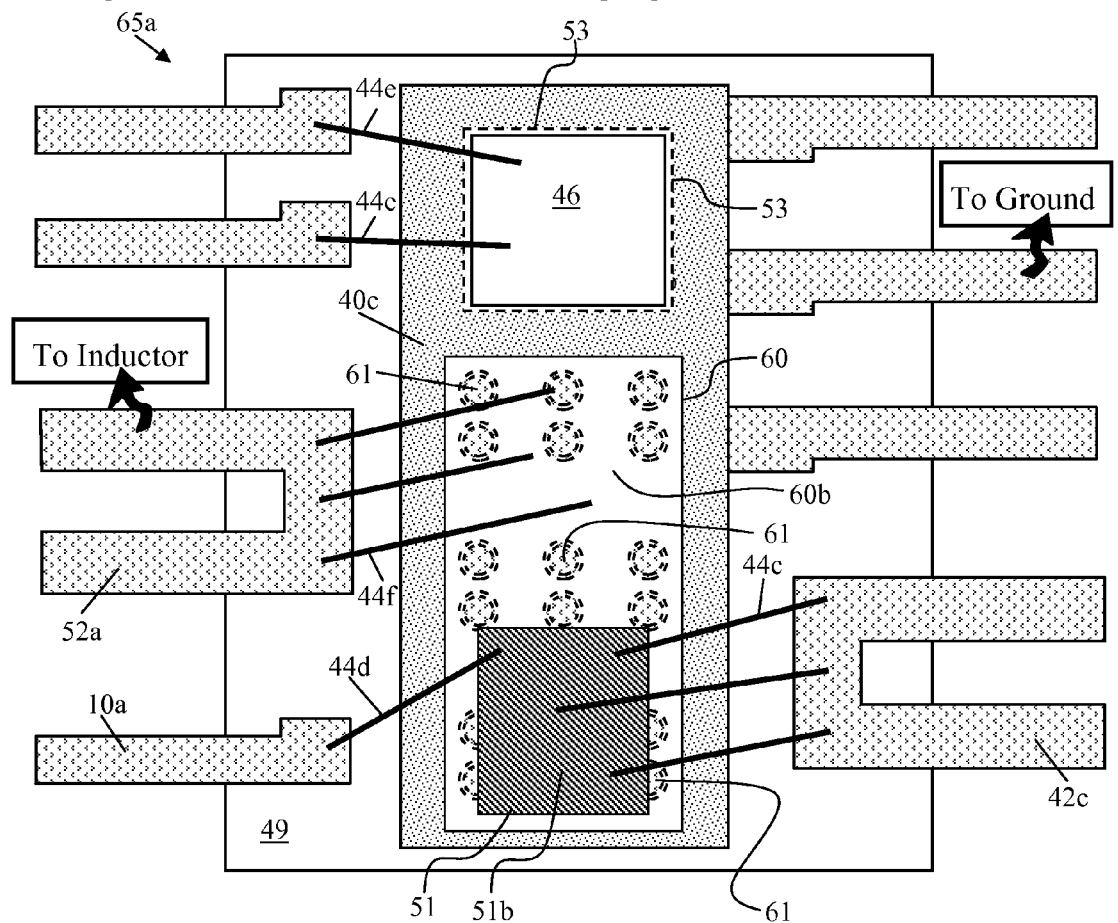
Fig. 5D Present Invention Packaging of Buck Power Converter

US 7,825,508 B2

MULTI-DIE DC-DC BUCK POWER CONVERTER WITH EFFICIENT PACKAGING

CROSS REFERENCE TO RELATED APPLICATIONS

This application is a continuation in part (CIP) of the following concurrently filed patent applications:

(A) "Bottom Source LDMOSFET Structure and Method", Ser. No. 11/495,803, Jul. 28, 2006, François Hébert, issued on Jun. 30, 2009 as U.S. Pat. No. 7,554,154.

(B) Title: "BOTTOM ANODE SCHOTTKY DIODE STRUCTURE AND METHOD" by François Hébert, filed on Jul. 22, 2007 with application Ser. No. 11/880,497 and issued on Dec. 15, 2009 as U.S. Pat. No. 7,633,135.

(C) Title: "A Multi-die DC-DC Boost Power Converter with Efficient Packaging", Inventors: Francois Hebert, Allen Chang, Peter Cheng, filed on Jul. 31, 2007 with application Ser. No. 11/830,951.

whose contents are incorporated herein by reference for any and all purpose.

FIELD OF INVENTION

This invention relates generally to the field of electrical power supply and conversion. More specifically, the present invention is directed to the physical level packaging of a switching power supply and DC-DC voltage converters.

BACKGROUND OF THE INVENTION

Owing to its compact size, low weight and generally high efficiency, switching power supplies and converters have enjoyed ever increasing market adoption in the consumer electronics industry. This is especially so in portable applications where compact size, low cost, low weight and long battery life are all highly important considerations. Also, due to increased complexities and features of portable devices, there is an increased demand for different voltage levels within one portable device. For example, a display may require a different operating voltage than an interface product, which may require a different operating voltage than a micro-processor. The various operating voltages for each of building blocks of the portable device can be provided by different DC-DC voltage converters.

One well known example of the switching power supply and conversion is a simplified buck power converter schematic 80 shown in FIG. 1. An unregulated DC input 2, VIN, is down converted into a regulated DC output 3, VOUT, through an energy storage and switching network having a Schottky diode 5, a vertical MOSFET 4 and an inductor 11. For those skilled in the art, the physical die of a vertical MOSFET has its source and drain built on the opposite surfaces of the die hence its device current flows in a direction perpendicular to the die surface, and this is why the device is referred to as a vertical device. A power regulating controller 13, whose internal details are omitted here, controls the gate 10 of the vertical MOSFET 4 with a drain 9 connected to the unregulated DC input 2, a source 8 connected to both the cathode 7 of the Schottky diode 5 and the inductor 11. The regulated DC output 3, being connected to the inductor 11, is also connected through a charging/discharging output capacitor 12 to ground 14. As illustrated, the vertical MOSFET 4 is a vertical N-channel FET with its device current flowing in a direction from the unregulated DC input 2 toward the Schottky diode 5. For those skilled in the art, by simply replacing the vertical MOSFET 4 with a vertical P-channel FET and reversing the connection polarity of the Schottky diode 5, the boost power converter schematic 1 will then down convert an unregulated negative input voltage (e.g., −24+/−10% Volt) into a regulated negative output voltage of lower magnitude (e.g., −3.3 Volt).

For embodiment into a physical product, the numerous integrated circuit (IC) dies corresponding to the Schottky diode 5, the vertical MOSFET 4 and the power regulating controller 13 need to be mounted onto different die pads of a lead frame to pack the semiconductor devices of the circuit into one package. At the packaging level, it is important to package the numerous IC dies efficiently and to use standard lead frames. The resulting benefits are reduced product size, lower cost, reduced time to market (by using standard available lead-frames) and in many cases include reduced circuit parasitics. For one example, a significant bond wire inductance 6a can accompany a bonding wire interconnecting the anode 6 of the Schottky diode 5 to the ground 14. For another example, a significant bond wire inductance 8a can accompany a bonding wire interconnecting the source 8 of the vertical MOSFET 4 to the inductor 11. These will be presently illustrated.

A prior art multi-die package 35 of the buck power converter schematic 80 is illustrated in FIG. 2. The Schottky diode 30 die typically comes with its cathode 30b as the bottom substrate and its anode 30a on the top. The vertical MOSFET 31 die typically comes with its MOSFET drain 31b as the bottom substrate and its MOSFET source and gate 31a on the top. Hence, two isolated die pads, Schottky diode die pad 30c and MOSFET die pad 31c, are required in the lead frame to seat the Schottky diode 30 die and the vertical MOSFET 31 die and to finally package them into one package covered with molding compound (not shown) before it is assembled onto a PC-board 33 with other circuit elements (such as inductors and capacitors) to complete the circuit. Additionally, bond wires 34a are required to effect an electrical connection between the cathode 30b of the Schottky diode 30 and the MOSFET source 31a of the vertical MOSFET 31 inside the package. As another illustrative part of the prior art multi-die package 35 although not essential for the understanding of the present invention, bond wires 34b are required to effect an electrical connection between the anode 30a of the Schottky diode 30 die and a ground lead 32.

As a minimum clearance between the two isolated die pads (Schottky diode die pad 30c and MOSFET die pad 31c) must be maintained for isolation and product reliability, this results in a larger package size and the use of non-standard lead frame thus leads to higher cost. The required bond wires 34a further increases the cost of the package. Additionally, the bond wires 34a, owing to their associated parasitic capacitance and inductance, can also cause a degradation of the power conversion efficiency of the boost power converter. In essence, there exists a need to reduce complexity and space requirement of the prior art multi-die package 35.

SUMMARY OF THE INVENTION

An efficiently packaged multi-die semiconductor package for a DC-DC buck converter application is proposed. The buck converter down converts an unregulated DC input into a regulated DC output. The buck converter has a low side Schottky diode and a high-side vertical MOSFET whose gate is controlled by a power regulating controller (PRC). The multi-die semiconductor package includes a lead-frame with a first die pad there on, the vertical MOSFET is placed atop the first die pad, and a Schottky diode with its cathode connected to the source of the vertical MOSFET.

In one embodiment, the Schottky diode is placed on the die pad side by side with the vertical MOSFET with the cathode of the Schottky diode electrically connected to the source of the vertical MOSFET via the first die pad. Correspondingly, the PRC die can be attached atop the first die pad via an insulating die bonding material to achieve a further reduced footprint of the first die pad with the Schottky diode, the vertical MOSFET and the PRC co-packaged atop the first die pad. As an alternative trade-off, a second die pad is provided on the lead-frame and the PRC die can be attached to the second die pad via a standard conductive die bonding material.

In an alternative embodiment the first die pad is grounded. Correspondingly, the vertical MOSFET is a vertical N-channel FET, the top of the Schottky diode die is its cathode and the bottom of the vertical MOSFET is its source. The Schottky diode die and the vertical MOSFET die are co-packaged atop the first die pad in a stacked way with the vertical MOSFET die atop the Schottky diode die for minimized vertical MOSFET source inductance, minimized Schottky diode anode inductance and easy heat sinking. With the first die pad grounded, the PRC die can be attached atop the first die pad via a standard conductive die bonding material to achieve a further reduced footprint of the first die pad with the Schottky diode, the vertical MOSFET and the PRC co-packaged atop the first die pad.

In a more detailed embodiment, the Schottky diode die is supplied with its cathode being its substrate and the Schottky diode die is packaged in a flip-chip configuration. Alternatively, the Schottky diode die is supplied with its anode being its substrate and the Schottky diode die can then be packaged in a conventional configuration.

For applications where both the unregulated DC input and the regulated DC output are negative voltages hence the vertical MOSFET is a vertical P-channel FET, the Schottky diode die is supplied with its bottom being its anode while the bottom of the vertical MOSFET being its source. The Schottky diode die and the vertical MOSFET die are then co-packaged side by side atop the first die pad. Correspondingly, the PRC die is attached atop the first die pad via an insulating die bonding material to achieve a further reduced footprint of the first die pad with the Schottky diode, the vertical MOSFET and the PRC co-packaged atop the first die pad. As an alternative trade-off, a second die pad is provided on the lead-frame and the PRC die can be attached to the second die pad via a standard conductive die bonding material.

For applications where both the unregulated DC input and the regulated DC output are negative voltages hence the vertical MOSFET is a vertical P-channel FET, the first die pad can be grounded. Correspondingly, the Schottky diode die can be supplied with its substrate being its cathode while the bottom of the vertical MOSFET being its source. The Schottky diode die and the vertical MOSFET die are co-packaged atop the first die pad in a stacked way with the vertical MOSFET die atop the Schottky diode die for minimized vertical MOSFET source inductance, minimized Schottky diode anode inductance and easy heat sinking. With the first die pad grounded, the PRC die can be attached atop the first die pad via a standard conductive die bonding material to achieve a further reduced footprint of the first die pad with the Schottky diode, the vertical MOSFET and the PRC co-packaged atop the first die pad.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative.

FIG. 1 illustrates a buck converter schematic.

FIG. 2 illustrates a prior art packaging of the buck power converter.

FIG. 3A, FIG. 3B and FIG. 3C illustrate a first embodiment of the present invention multi-die semiconductor package;

FIG. 3D illustrates a variation of FIG. 3C as an alternative trade-off;

FIG. 4A, FIG. 4B and FIG. 4C illustrate a second embodiment of the present invention multi-die semiconductor package; and FIG. 5A, FIG. 5B, FIG. 5C and FIG. 5D illustrate a third embodiment of the present invention multi-die semiconductor package.

DETAILED DESCRIPTION OF SPECIFIC EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 3A (side view), FIG. 3B (top view) and FIG. 3C (top view) illustrate a first embodiment of the present invention multi-die package 45 and 45a with Schottky diode 30 and the vertical MOSFET 51 enclosed in molding compound 49. Compared with the prior art multi-die package 35 of FIG. 2 that uses two die pads (Schottky diode die pad 30c and MOSFET die pad 31c), the present invention only needs a lead-frame with first die pad 40c for packaging both the Schottky diode 30 and the vertical MOSFET 51 into one package to be mounted onto a PC-board 43. While the die-level device terminal configuration for the Schottky diode is the same between FIG. 2 and FIG. 3A (bottom substrate=cathode 30b, top surface=anode 30a), the die-level device terminal configuration for the vertical MOSFET is reversed between FIG. 2 and FIG. 3A in that:

FIG. 2: bottom substrate=MOSFET drain 31b, top surface=MOSFET source and gate 31a FIG. 3A: bottom substrate=MOSFET source 52a, top surface=MOSFET gate and drain 52b As noted in FIG. 2B, the vertical MOSFET 31 die typically comes with its MOSFET drain 31b as the bottom substrate and its MOSFET source and gate 31a on the top. Hence, to realize the various embodiments of the present invention wherein the bottom substrate of the MOSFET is its source the MOSFET must be custom made accordingly. Such a bottom source MOSFET is disclosed in patent application Ser. No. 11/495,803 filed on Jul. 28, 2006 and is incorporated herein as reference. In this way, the present invention effected the required connection between the Schottky diode cathode 30b and the MOSFET source 51a with the first die pad 40c while eliminating the otherwise complexity of bond wires in between (bond wires 34a of FIG. 2). Thus, compared with the prior art multi-die package 35 of FIG. 2B, the first die pad 40c of the present invention advantageously realizes a smaller package that would take up a smaller PC-board 43 size. The absence of the bond wires 34a decreases the packaging complexity hence lower the manufacturing cost. Additionally, undesirable parasitic capacitance and inductance associated with the bond wires 34a are also eliminated. As a side remark, the bond wires 34b between the Schottky diode anode 30a and the ground lead 32 in the prior art are still needed in this present invention multi-die package 45 and they are labeled bond wires 44b terminated in a corresponding ground lead 42a. As another side remark, the bond wires 44c between the MOSFET drain 51b and a VIN lead 42c in the present invention are also required in the prior art multi-die package 35, they were simply omitted in the prior art multi-die package 35 to avoid unnecessary obscuring details. As yet another side remark, the bond wires 44d between the MOSFET gate 51b and a gate lead 10a in the present invention are also required in the prior art multi-die package 35, likewise not illustrated in the prior art multi-die package 35 to avoid unnecessary obscuring details.

The incorporation of the PRC 46 die in the packaging is illustrated in FIG. 3C. To maintain the numerous advantages of the first die pad 40c which is not grounded, the PRC 46 die is attached to the first die pad 40c via an insulating die bonding material 47 such as non-conductive epoxy. Electrical connections between the PRC 46 die and the leads are effected via bond wires 44e as illustrated. Thus, the Schottky diode 30, the vertical MOSFET 51 and the PRC 46 are co-packaged atop the first die pad 40c for a further reduced footprint. As an alternative to FIG. 3C, FIG. 3D illustrates a trade-off where the (PRC) 46 die is attached to a second die pad 46c via a standard conductive die bonding material 53. Comparing with the embodiment of FIG. 3C, FIG. 3D enjoys the advantage of using a standard conductive die bonding material while requiring a larger packaging footprint caused by employing a first die pad 40c and a second die pad 46c.

FIG. 4A (side view), FIG. 4B (top view) and FIG. 4C (top view) illustrate a second embodiment of the present invention multi-die package 50 and 50a with Schottky diode 40 and the vertical MOSFET 51 enclosed in molding compound 49. Compared with the previous present invention multi-die package 45 of FIG. 3A, the die-level device terminal configuration for vertical MOSFET is the same between FIG. 3A and FIG. 4A (bottom substrate=MOSFET source 51a, top surface=MOSFET gate and drain 51b). However, the die-level device terminal configuration for the Schottky diode is reversed between FIG. 3A and FIG. 4A in that:

FIG. 3A: bottom substrate=Schottky diode cathode 30b, top surface=Schottky diode anode 30a FIG. 4A: bottom substrate=Schottky diode anode 40a, top surface=Schottky diode cathode 40b As noted in FIG. 2B, the Schottky diode 30 die typically comes with its cathode 30b as the bottom substrate and its anode 30a on the top. Hence, to realize the various embodiments of the present invention wherein the bottom substrate of the Schottky diode is its anode the Schottky diode must be custom made accordingly. Such a bottom anode Schottky diode is disclosed in patent application entitled "BOTTOM ANODE SCHOTTKY DIODE STRUCTURE AND METHOD" filed on Jul. 19, 2007 and is incorporated herein as reference. In this way, the present invention multi-die package 50 also effected the required connection between the Schottky diode cathode 40b and the MOSFET source 51a with a first die pad 40c while eliminated the otherwise prior art complexity of bond wires in between (bond wires 34a of FIG. 2). However, instead of placing the Schottky diode 30 and the vertical MOSFET 51 side by side as in FIG. 3A, the multi-die package 50 co-packages the Schottky diode 40 and the vertical MOSFET 51 atop the first die pad 40c in a stacked way with the vertical MOSFET 51 die atop the Schottky diode 40 die and this results in a further reduced package that would take up a smaller PC-board 43 size. Additionally, as the Schottky diode anode 40a can be inherently grounded through the first die pad 40c of lead-frame, the bond wires 44b of FIG. 3A are eliminated as well resulting in further reduced PC-board 43 size, minimized bond wire inductance 6a. Another more subtle advantage of stacking the vertical MOSFET 51 atop the Schottky diode 40, instead of stacking the Schottky diode 40 atop the vertical MOSFET 51, comes from the Schottky diode 40 having a processing cost per unit die area that is lower than the vertical MOSFET 51. Hence, a packaging scheme with the Schottky diode 40 being the larger-sized bottom die results in a lower overall die processing cost. As a side remark, the bond wires 44f between the MOSFET source 51a and the Schottky cathode lead 52a in this present invention multi-die package 50 were required in the prior art and they were simply omitted in FIG. 2 to avoid unnecessary obscuring details. Likewise, the bond wires 44c between the MOSFET drain 51b and the VIN lead 42c in the present invention were also omitted in the prior art multi-die package 35. Similarly, the bond wires 44d between the MOSFET gate 51b and the gate lead 10a in the present invention were also omitted in the prior art multi-die package 35.

The incorporation of the PRC 46 die in the packaging is illustrated in FIG. 4C. As the first die pad 40c is already grounded, the PRC 46 die can be simply attached to the first die pad 40c via a standard conductive die bonding material 53 such as a conductive epoxy or solder. Additional electrical connections between the PRC 46 die and the leads are effected via bond wires 44e as illustrated. Thus, the Schottky diode 40, the vertical MOSFET 51 and the PRC 46 are co-packaged atop the first die pad 40c.

FIG. 5A, FIG. 5B, FIG. 5C and FIG. 5D illustrate a third embodiment of the present invention multi-die semiconductor package. As noted in FIG. 2 before, the Schottky diode 30 die typically comes with its cathode 30b as the bottom substrate and its anode 30a on the top. Hence, to realize the various embodiments of the present invention wherein the bottom substrate of the Schottky diode is its anode the Schottky diode must be custom made accordingly. In fact, reference (B) entitled "BOTTOM ANODE SCHOTTKY DIODE STRUCTURE AND METHOD", as incorporated herein by reference, describes the structure of such bottom anode Schottky diode and how it can be made. However, as a simple alternative as illustrated in FIG. 5A, the Schottky diode can also be made with a typical process albeit into a flip-chip BGA (ball grid array) style Schottky diode 60 thus packaged with its cathode substrate 60b on the top and its anode solder balls 61 at the bottom. The resulting embodiments 65 and 65a, employing the packaging scheme as already illustrated in FIG. 4A, FIG. 4B and FIG. 4C, is illustrated in FIG. 5B, FIG. 5C and FIG. 5D.

By now it should become clear to those skilled in the art that the numerous embodiments just described can be readily modified to suit other specific applications as well. For example, for applications wherein both the unregulated DC input 2 and the regulated DC output 3 are negative voltages hence the vertical MOSFET 4 is a vertical P-channel FET, the substrate of the Schottky diode 5 die should be its anode and the bottom of the vertical MOSFET 4 can be its source for a side by side co-packaging atop a first die pad. The PRC 46 die can then be attached to the first die pad via an insulating die bonding material. As an alternative tradeoff, a second die pad can be provided on the lead-frame and the PRC die can then be attached to the second die pad via a standard conductive die bonding material. In another embodiment, the first die pad is grounded, the substrate of the Schottky diode 5 die is its cathode and the bottom of the vertical MOSFET 4 is its source then the Schottky diode 5 die and the vertical MOSFET 4 die are co-packaged atop the first die pad in a stacked way with the vertical MOSFET 4 die atop the Schottky diode 5 die for minimized vertical MOSFET source inductance and easy heat sinking. The PRC 46 die is now attached to the first die pad via a standard conductive die bonding material.

While the description above contains many specificities, these specificities should not be constructed as accordingly limiting the scope of the present invention but as merely providing illustrations of numerous presently preferred embodiments of this invention. For example, the present invention can be applied to circuit configurations with or without the PRC 46 die.

Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed are:

1. An efficiently packaged multi-die semiconductor package for DC-DC buck converter application where the buck converter down converts an unregulated DC input into a regulated DC output, the multi-die semiconductor package comprises:

a lead-frame having a first die pad thereon; a vertical MOSFET placed atop said first die pad; and a Schottky diode with its cathode connected to the source of the vertical MOSFET, wherein the first die pad is grounded, the vertical MOSFET is a vertical N-channel FET, the bottom of the Schottky diode die is its anode, the bottom of the vertical MOSFET is its source and the top of the vertical MOSFET has its gate and drain whereby the Schottky diode die and the vertical MOSFET die are co-packaged atop the first die pad in a stacked way with the vertical MOSFET die atop the Schottky diode die for minimized vertical MOSFET source inductance and easy heat sinking.

2. The multi-die semiconductor package of claim 1 wherein the substrate of the Schottky diode die is its cathode with the Schottky diode die being packaged in a flip-chip configuration.

3. The multi-die semiconductor package of claim 1 wherein the substrate of the Schottky diode die is its anode with the Schottky diode die being packaged with its substrate connected to the first die pad.

4. The multi-die semiconductor package of claim 1 wherein the PRC die is further attached to the first die pad via a conductive die bonding material whereby achieve a further reduced footprint of the first die pad with the vertical MOSFET, the Schottky diode and the PRC co-packaged atop the first die pad.

5. An efficiently packaged multi-die semiconductor package for DC-DC buck converter application where the buck converter down converts an unregulated DC input into a regulated DC output, the multi-die semiconductor package comprises:

a lead-frame having a first die pad thereon; a vertical MOSFET placed atop said first die pad; a Schottky diode with its cathode connected to the source of the vertical MOSFET; and a power regulating controller (PRC) for controlling the gate of the vertical MOSFET, wherein both the unregulated DC input and the regulated DC output are negative voltages hence the vertical MOSFET is a vertical P-channel FET, the first die pad is grounded, the substrate of the Schottky diode die is its cathode, the bottom of the vertical MOSFET is its source and the top of the vertical MOSFET has its gate and drain whereby the Schottky diode die and the vertical MOSFET die are co-packaged atop the first die pad in a stacked way with the vertical MOSFET die atop the Schottky diode die for minimized vertical MOSFET source inductance and easy heat sinking.

6. The multi-die semiconductor package of claim 5 wherein the PRC die is further attached to the first die pad via a conductive die bonding material whereby achieve a further reduced footprint of the first die pad with the Schottky diode, the vertical MOSFET and the PRC co-packaged atop the first die pad.

* * * * *